United States Patent [19]
Jutamulia et al.

[11] Patent Number: 5,321,270
[45] Date of Patent: *Jun. 14, 1994

[54] COMPACT VECTOR-MATRIX MULTIPLIER SYSTEM EMPLOYING ELECTRON TRAPPING MATERIALS

[75] Inventors: Suganda Jutamulia, Fremont, Calif.;
George M. Storti, Washington, D.C.;
William Seiderman, Frederick;
Joseph Lindmayer, Potomac, both of Md.

[73] Assignee: Quantex Corporation, Rockville, Md.

[ * ] Notice: The portion of the term of this patent subsequent to Jul. 28, 2009 has been disclaimed.

[21] Appl. No.: 921,008

[22] Filed: Jul. 28, 1992

Related U.S. Application Data

[63] Continuation of Ser. No. 721,345, Jul. 1, 1991, Pat. No. 5,134,686, which is a continuation-in-part of Ser. No. 419,479, Oct. 10, 1989, Pat. No. 5,029,253.

[51] Int. Cl.⁵ .............................................. G06G 7/00
[52] U.S. Cl. .................................... 250/484.4; 395/25
[58] Field of Search .................. 250/327.2, 484.1; 395/25; 364/822, 841

[56] References Cited

U.S. PATENT DOCUMENTS 5,134,686 7/1992 Jutamulia et al. ................ 250/484.1

*Primary Examiner*—Paul M. Dzierzynski
*Assistant Examiner*—Drew A. Dunn
*Attorney, Agent, or Firm*—Ostrolenk, Faber, Gerb & Soffen

[57] ABSTRACT

A vector-matrix multiplier in which a matrix is stored in an electron trapping material by exposing the material to visible light passed through a liquid crystal device, which acts as a mask. The visible light raises electrons in the electron trapping material to a higher energy level at the exposed locations. Infrared light is then passed through the liquid crystal device to form an input vector, which is projected onto the electron trapping material. The infrared light releases electrons from the higher energy level, resulting in emission of a pattern of visible light. The emission of visible light from the electron trapping material forms an output representing the product of the input vector and the matrix.

3 Claims, 7 Drawing Sheets

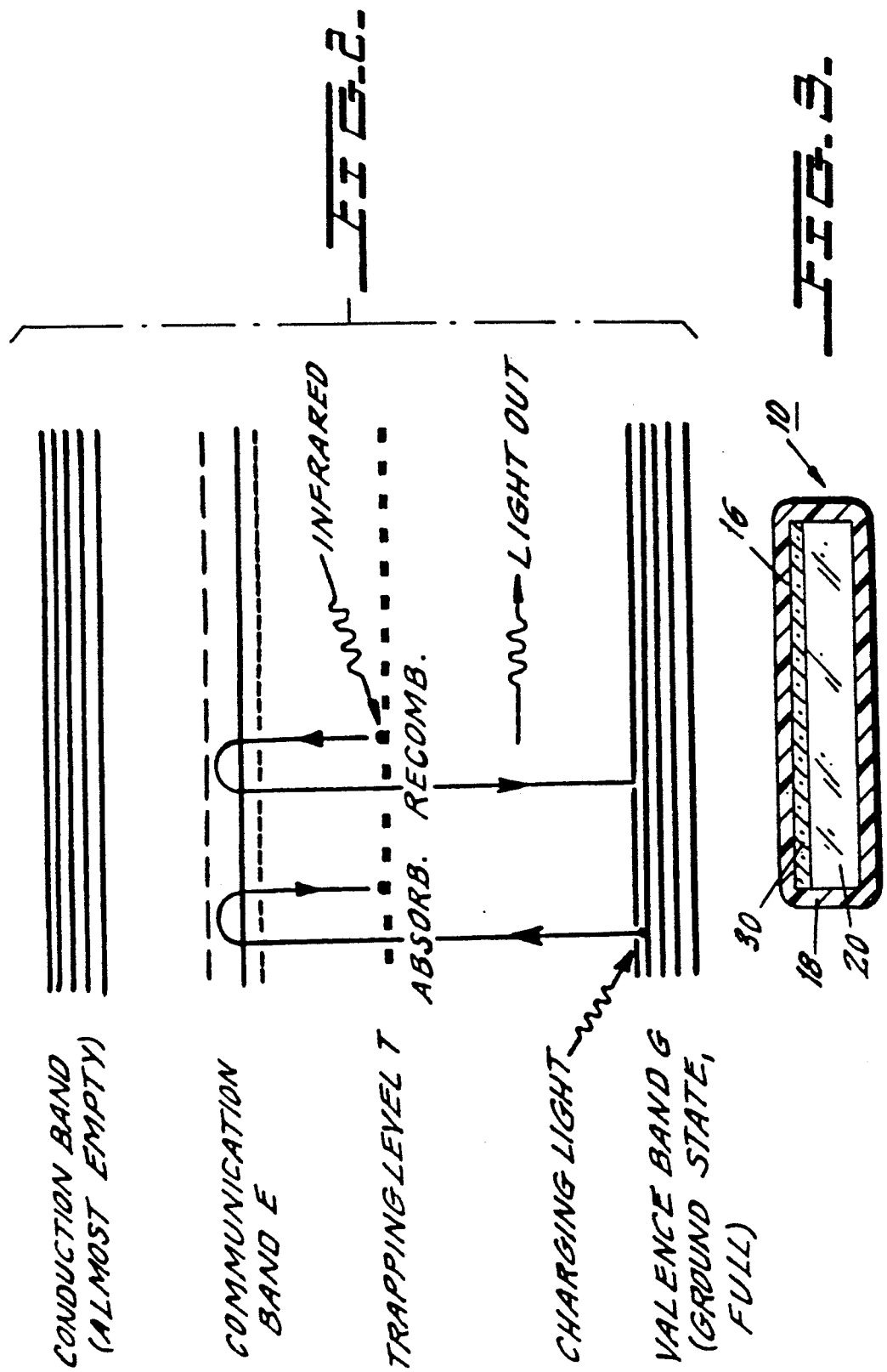

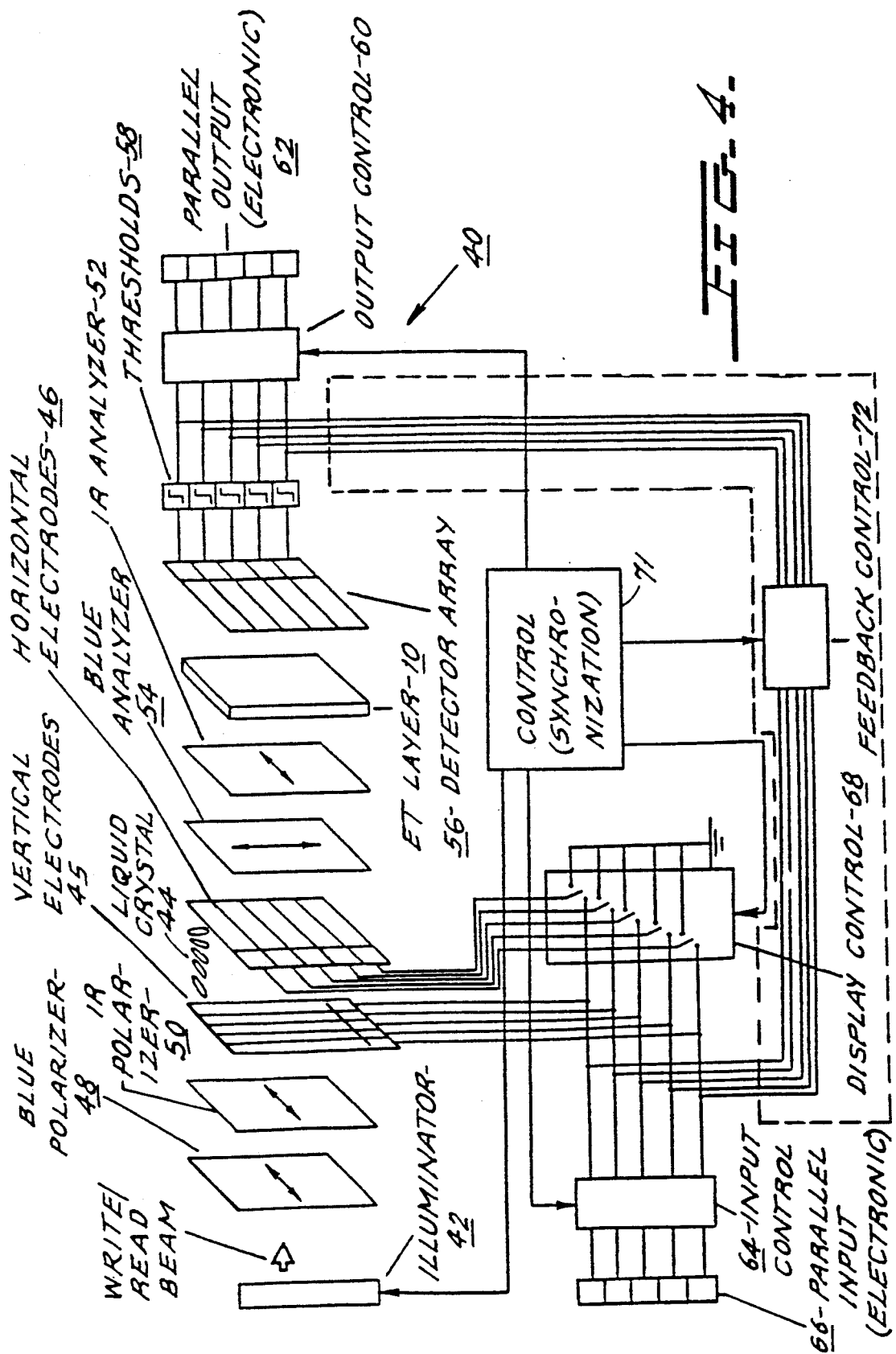

$$(2V_i^m-1)(2V_j^m-1)$$

|  | $V_i^m=0$ | $V_i^m=1$ |
|---|---|---|
| $V_j^m=0$ | +1 | -1 |
| $V_j^m=1$ | -1 | +1 |

FIG. 6A.

Truth table of XNOR

|  | $V_i^m=0$ | $V_i^m=1$ |
|---|---|---|
| $V_j^m=0$ | True | False |
| $V_j^m=1$ | False | True |

+1 is determined by XNOR

FIG. 6B.

Truth table of XOR

|  | $V_i^m=0$ | $V_i^m=1$ |
|---|---|---|
| $V_j^m=0$ | False | True |
| $V_j^m=1$ | True | False |

-1 is determined by XOR

FIG. 6C.

COMPACT VECTOR-MATRIX MULTIPLIER SYSTEM EMPLOYING ELECTRON TRAPPING MATERIALS

This is a continuation of application Ser. No. 07/721,345, filed Jul. 1, 1991, now U.S. Pat. No. 5,134,686, which is a continuation-in-part of U.S. application Ser. No. 07/419,479, filed Oct. 10, 1989, now U.S. Pat. No. 5,029,253, entitled "Spatial Light Modulator Using Electron trapping Materials", the disclosure of which is herein incorporated by reference.

BACKGROUND OF THE INVENTION

1. Field of the Invention

The present invention relates to optical signal processing using electron trapping materials and, more specifically, to the use of electron trapping materials in a compact optical vector-matrix multiplier system.

2. Description of the Related Art

The capabilities of electron trapping materials having been demonstrated in various disciplines of optical signal processing. For example, the application of electron trapping materials to parallel Boolean logic has been reported by S. Jutamulia, G. M. Storti, J. Lindmayer, and W. Seiderman in "Application of Electron trapping (ET) Materials to Optical Parallel Logic Processing," *Proc. SPIE.* 1151, 83, 1989. The use of electron trapping materials in memory devices has been demonstrated by S. Jutamulia, J. Lindmayer, and G. Storti in "Optical Pattern Recognition and Associative Memory Using Electron trapping Materials," *Proc. SPIE* 1053, 67, 1989. Recently, the capabilities of electron trapping materials applied to Hopfield type neural networks has been discussed by S. Jutamulia, G. M. Storti, J. Lindmayer, W. Seiderman in "Optical Neural Nelectron trappingwork Digital Multi-Value Processor with Learning Capability Using Electron trapping Materials," *Proc. SPIE* 1215, 457, 1990.

A neural network model is basically represented by a matrix-vector multiplication. J. J. Hopfield, "Neural Networks and Physical Systems with Emergent Collective Computational Abilities", *Proc. Natl. Acad. Sci. USA*, 79, 2554–2558 (1982). Vector-matrix multiplication can be performed optically by converting the vector into matrix form, forming an image of that matrix, and optically multiplying that image with the image of a vector. The conversion of a vector into a matrix is accomplished by the following interconnection matrix $T_{ij}$:

$$T_{ij} = (2V_i - 1)(2V_j - 1), \quad \text{for } i \neq j \qquad \text{(Eq. 1)}$$
$$= 0, \quad \text{for } i = j$$

where $V_i$ and $V_j$ are the ith and jth elements of the vector, and where i and j represent the row and column of the matrix elements.

For example, the vector (1,0,0,1,1) will convert into the matrix:

$$T_{ij} = \begin{matrix} 0 & -1 & 1 & 1 & 1 \\ -1 & 0 & 1 & -1 & -1 \\ -1 & 1 & 0 & -1 & -1 \\ 1 & -1 & -1 & 0 & 1 \\ 1 & -1 & -1 & 1 & 0 \end{matrix}$$

Electron trapping materials are useful in performing optical multiplications. As described in A. D. McAulay, "Optical Orthogonal Neural Network Associative Memory with Luminescent Rebroadcasting Devices," *Int. Joint Conf. Neu. Net.* IEEE—89CH2765—G, Volume III, 483-485 (1985), multiplication can be performed by writing one image, say A, onto an electron trapping material using visible light, and then reading with IR light in a pattern representing the second image B. The output luminescent at each pixel position is proportional to the analog product of the read intensity at that pixel and the stored value at that pixel.

While the prior techniques for optical vector-matrix multiplication such as disclosed by McAulay have been successfully demonstrated, they use fan-out and fan-in lenses and thus require precise optical alignment and take up a considerable amount of space. Accordingly, optical vector-matrix multiplication has been limited to laboratory bench top systems. Thus, a need exists for a vector-matrix multiplier which is compact, rugged and which can actually be implemented in an optical computer.

SUMMARY OF THE INVENTION

A primary object of the present invention is therefore to provide a compact and versatile vector-matrix multiplier employing electron trapping materials.

Another object of the invention is to provide a rugged vector-matrix multiplier that does not use lenses in the focusing of light within the system and thus does not have the size and sensitivity drawbacks heretofore found in other similar multiplier systems.

A further object of the present invention is to provide an associative memory using a compact vector-matrix multiplier structure.

A still further object of the invention is to provide a compact vector-matrix multiplier/associative memory which can be built as a chip for use in an optical computer.

These and other objects of the invention are achieved by a method of optically multiplying a vector and a matrix by first passing visible light through a liquid crystal device to form a visible light image of a matrix and exposing an electron trapping material to the visible light image, whereby electrons in the electron trapping material at locations corresponding to the visible light image are raised to a higher energy level where they are trapped, resulting in the storage of the matrix in the electron trapping material in the form of a density pattern of trapped electrons in the higher energy level. Next, infrared light is passed through the liquid crystal device to form a two dimensional infrared image of a vector, and the electron trapping material is exposed to the infrared image of the vector, the infrared light releasing the trapped electrons from the higher energy level at locations corresponding to the infrared image, resulting in an emission of visible light from the electron trapping material at those locations. The emission of visible light from the electron trapping material is directed to a visible light detector to obtain an electrical output representing the product of said vector and said matrix.

The matrix stored by the electron trapping material is preferably formed of binary elements of 0, +1 and −1, and a bias is initially applied to the electron trapping material by exposing said electron trapping material to a uniform application of blue light. Thereafter, the matrix elements of +1 are written with blue light into the electron trapping material and the matrix elements of −1 are written with infrared light into the electron trapping material.

The electron trapping material is capable of storing multiple matrices and can be used as an associative memory by feeding back the output from the detector and reapplying it an input vector.

In an alternative method for optically multiplying a vector and a matrix, the electron trapping material is initially flooded with visible light to uniformly charge said material by raising electrons in said material to a higher energy level, where they are trapped. Then the electron trapping material is subjected to infrared light at selected locations such that electrons at the selected locations are released from their traps and fall back down to a lower energy level, while the remaining locations of said material not exposed to said infrared light remain charged with trapped electrons in a pattern corresponding to a matrix to be stored. Next, the electron trapping material is subjected to a two-dimensional image of a vector in the form of infrared light, the infrared light releasing trapped electrons from the higher energy level, resulting in an emission of a pattern of visible light from the electron trapping material Finally, the emission of visible light from the electron trapping material is directed to a visible light detector to obtain an electrical output representing the product of the vector and the matrix.

The first method is implemented by a vector-matrix multiplier system that includes (1) a visible light and near infrared light source; (2) a liquid crystal television which operates either under control of a computer or in conjunction with visible and infrared polarizers and visible and infrared analyzers to provide appropriate masking of the light from the light source for creating images of the vectors and matrices to be multiplied; (3) a 2-dimensional screen of electron trapping material; (4) an array of linear detectors and thresholders; and (5) for use of the system as an associative memory, a feedback system that recirculates the output as a input for iterative vector-matrix multiplication.

The second method is preferably implemented by a system that includes an a visible light source and an infrared diode array in place of elements (1) and (2) above.

The entire system is preferably formed into a multilayer optoelectronic chip.

BRIEF DESCRIPTION OF THE DRAWINGS

The above and other features and advantages of the present invention will become apparent when the following detailed description is read in conjunction with the accompanying drawings.

FIG. 2 shows the principles of operation of the electron trapping material used in the present invention.

FIG. 3 shows the basic structure of the electron trapping screen.

FIG. 4 illustrates an optical setup for the vector-matrix multiplier system employing an electron trapping screen in accordance with the present invention.

FIG. 6A, 6B and 6C show how the XOR are XNOR functions properly implement the Hopfield interconnection matrix.

DETAILED DESCRIPTION OF THE PREFERRED EMBODIMENT

In view of the importance of electron trapping materials to the present invention, a brief review of their relevant characteristics, which are more fully described in the cited patents, is appropriate.

A. Electron Trapping Materials

Figure 1:
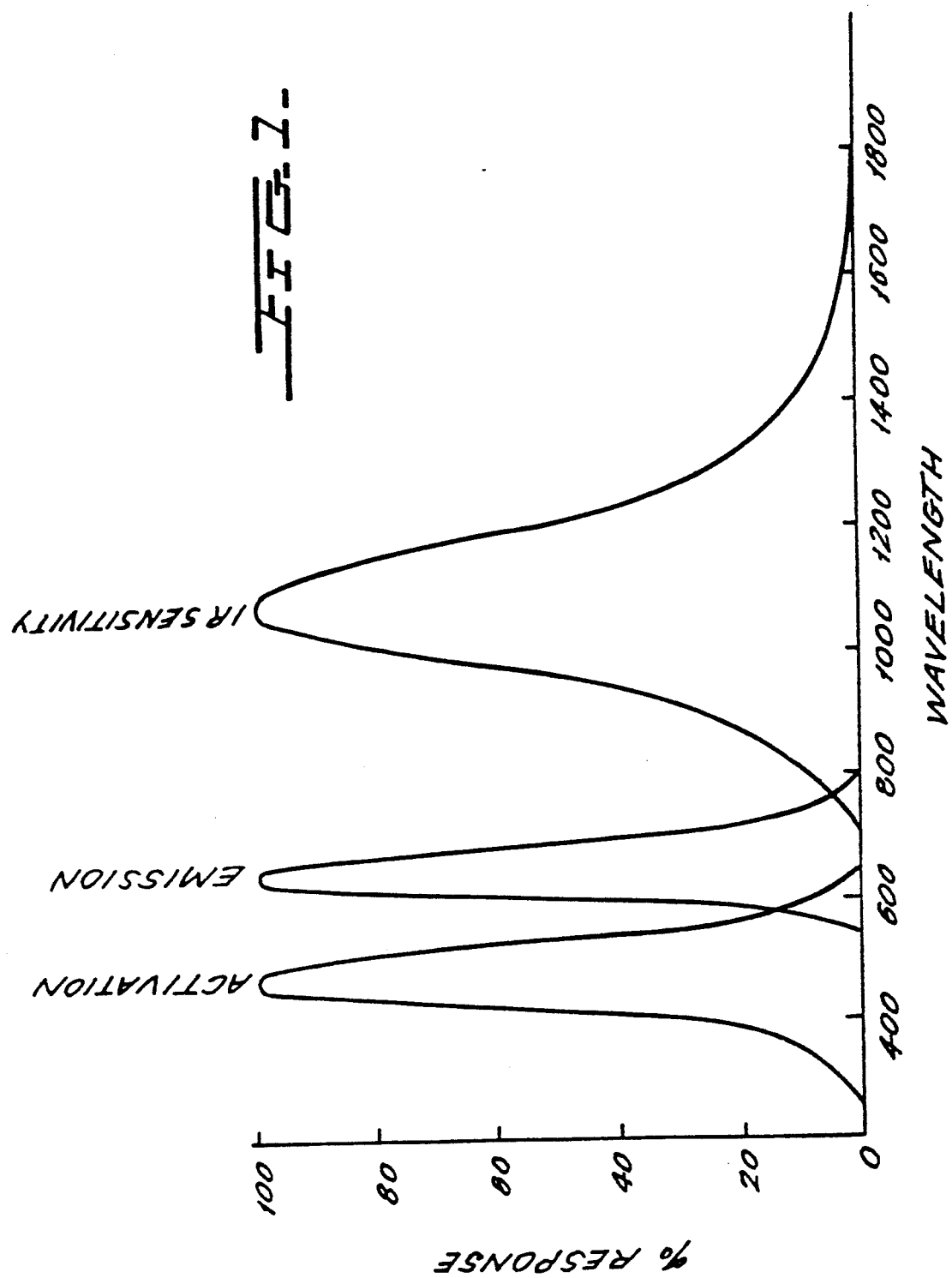
FIG. 1 shows the excitation, activation and emission spectra of a typical electron trapping material utilized in the present invention.

Electron trapping materials characteristically can emit different output photons which correlate spatially in intensity with input photons. The preferred electron trapping material of the present invention is formed of an alkaline earth metal sulfide base doped with rare earth impurities. A number of different electron trapping materials have been developed by the assignee of the present application. For example, U.S. Pat. No. 4,839,092 discloses a material formed of a strontium sulfide base doped with samarium and europium (SrS:Sm,Eu). This material outputs orange light centered at 620 nm. Similarly, U.S. Pat. No. 4,842,960 discloses a material formed of a mixed strontium sulfide/calcium sulfide base doped with samarium and europium/cerium (SrS/CaS Sm,Eu/Ce). This material also emits orange light, but has a very high efficiency and a brighter output than the material without calcium sulfide. As shown in FIG. 1, the activation wavelength of this preferred SrS/CaS:Sm,Eu/Ce material is about 450 nm, its emission wavelength is orange (about 630 nm) and it stimulation wavelength is near-infrared. U.S. Pat. No. 4,879,186 discloses a material formed of a calcium sulfide base doped with samarium and europium (CaS:Sm,Eu), which outputs red light centered at 650 nm.

Each of the above electron trapping materials have electron traps with depths of about 1.0 to 1.2 electron volts. Further details of the materials and the processes for making the materials are set forth in the disclosure of each of the abovereferred U.S. patents, which are herein incorporated by reference.

Briefly, the mechanism for light emission of electron trapping materials can be explained as follows, using the SrS:Sm,Eu material as an example, with reference to FIG. 2: Both ground and excited states of each impurity exist within the band gap of the wide-band-gap (approx. 4.4 eV) host material Short wavelength visible light (e.g., blue) excites electrons from the ground state (valence band G) to an excited state of Eu (communication band E), from whence the electrons transfer over to Sm. The electrons remain in the ground state of Sm (trapping level T) for very long times. However, subsequent exposure to IR light excites the trapped electrons to the excited states of Sm, the electrons transfer to the excited states of Eu and return to the ground state of Eu with the emission of orange/red light. By way of the above mode of operation, the electron trapping materials can be used to store optical information in the form of trapped electrons. This has been described by J Lindmayer, P. Goldsmith, and C. Wrigley, in "Electronic Optical-Storage Technology Approaches Development Phase", *Laser Focus World*, p. 119, Nov. 1989.

In addition to storage, electron trapping materials are capable of performing multiplication, addition, and subtraction within a dynamic range over four orders of magnitude. The orange/red emission intensity is proportional to the product of the blue write-in intensity and the IR readout intensity The addition and subtraction are performed by increasing and decreasing the number of trapped electrons. These operations are physically carried out by exposing the electron trapping material to blue and IR light, respectively.

The physical structure of the electron trapping screen will now be described in greater detail. As shown in FIG. 3 in vertical cross-section, screen 10 consists of a substrate 20 coated with an electron trapping material 30. The substrate 20 may be any transparent material such as glass, quartz or sapphire. The material 30 establishes a planar surface 16. An optical transparent coating 18 may encapsulate the material 30 and substrate 20.

Material 30 is preferably deposited upon substrate 20 using thin film techniques, preferably by physical or chemical vapor deposition Details concerning the preferred thin film deposition process are set forth in the present assignee's U.S. Pat. Nos. 4,830,875 and 4,915,982, which are herein incorporated by reference.

Referring now to FIG. 4, the vector-matrix multiplier system of the present invention consists of the hardware outside of the broken lines designated by reference numeral 40. The hardware within the broken lines is used for feedback if the system is to be used as an associative memory, described later.

Vector-matrix system 40 consists of an electron trapping screen 10 and a light illuminator 42 on opposite sides of a liquid crystal TV 44. LCTV 44 has separately controllable vertical electrodes 45 and horizontal electrodes 46. A blue light polarizer 48 and an IR polarizer 50 are disposed between illuminator 42 and LCTV 44. An IR analyzer 52 and blue analyzer 54 are disposed between LCTV 44 and electron trapping screen 10.

As mentioned previously, electron trapping layer 10 is charged with visible light, and outputs visible light when stimulated by IR light. The visible light output from electron trapping layer 10 is detected by detector array 56, and the electrical signals from detector array 56 are differentiated by an array of thresholders 58. The outputs from thresholder array 58 is gated through output control 60 to parallel output 62, (or alternatively fed back to control LCTV 44 if the device is utilized as an associative memory, as described later).

Light illuminator 42, described in greater detail below, is controllable to output either blue light (for changing electron trapping layer 10) or IR light (for stimulating electron trapping layer 10). To store vectors in electron trapping layer 10, illuminator 42 is controlled to output blue light while the vertical and horizontal electrodes 45, 46 of LCTV 44 are simultaneously controlled to from an appropriate mask so as to create a 2-D blue image of the vector on the electron trapping layer. The elements of the vector to be written into electron trapping layer 10 are input electronically in parallel via parallel input 64 and input control 66, and operating in conjunction with display control 68 and determine the ON/OFF state of the electrodes of LCTV 44. The operation of parallel input 64, parallel output 62, display control 68 and light illuminator 42 are synchronized by synch control 70.

Figure 5:
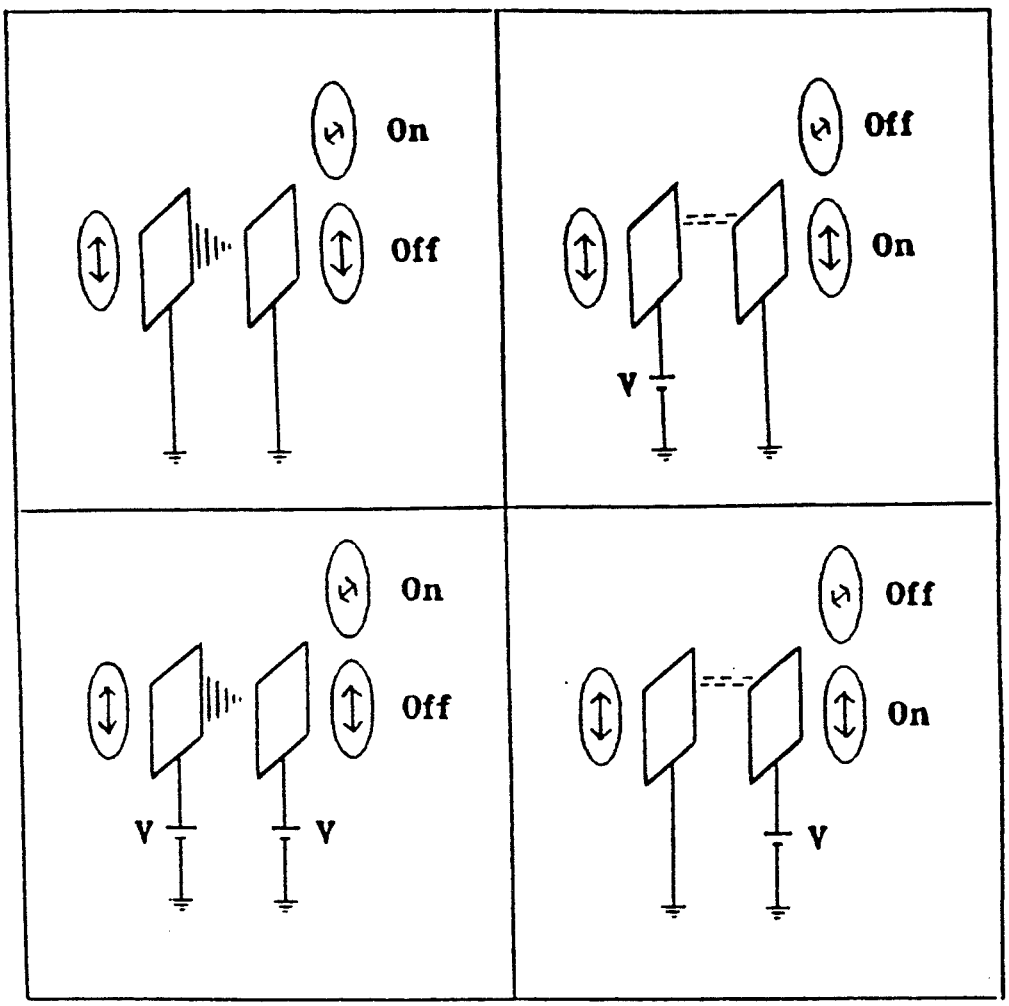
FIG. 5 shows the operation of the liquid crystal TV in performing XOR and XNOR functions

The formation of images by LCTV 44 is now described in greater detail. If the potential on both the vertical and horizontal electrodes of LCTV 44 at the location of a particular element is the same (i.e., if both are at ground or both are at potential V), then a polarization rotation of 90° is effected by LCTV 44. On the other hand, if the potential on both electrodes is opposite (i.e., if one is at ground and the other is at potential V), then the polarization angle of the incoming light is not rotated. The net result, as shown in FIG. 5, taking into account the relative orientation of the polarizers 48, 50 and analyzers 52, 54 is that an XNOR function is performed by LCTV 44 for blue light ($V_i$ XNOR $V_j$) and an XOR function is performed by LCTV 44 for IR light ($V_i$ XNOR $V_j$), where $V_i$ and $V_j$ are the potentials applied to the LCTV vertical and horizontal electrodes. As shown in FIGS. 6A, 6B and 6C, these functions properly implement the Hopfield equation $(2V_i-1)(2V_j-1)$ for $i \neq j$.

Figure 7:
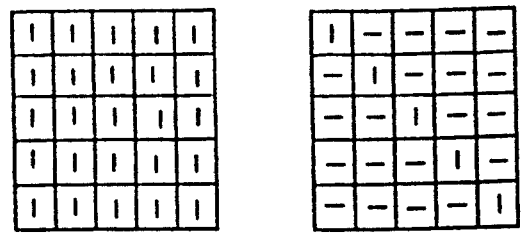
FIG. 7 shows the configuration of the polarizer and analyzer to obtain the required zero diagonal matrix

There are two methods for obtaining a zero diagonal matrix i.e. $M_{ij}=0$ when $i=j$, which is required by the Hopfield matrix:

1. Since the IR mode performs XOR, $M_{ij}=0$ for $i=j$ is obtained inherently. However, the blue mode performs XNOR that produces $M_{ij}=1$ for $i=j$. To make $M_{ij}=0$ for $i=j$, the blue polarizer pair at the position $i=j$ must be parallel in order to perform XOR instead of XNOR. Thus, the blue analyzer must be made as shown in FIG. 7.
2. The second method is to subtract $M_{ij}$ by 1 for $i=j$ using IR light. However, this would be a sequential process, where is subtracted by 1 for $i=1$ to $i=n$, one by one, because to subtract $M_{ll}$ we have to assign $V_{i=l} \neq V_{j=l}$ and $V_{i \neq l} = V_{j \neq l}$.

This is repeated until $i=n$. Thus, it takes n steps to zero the diagonal elements of a nxn matrix.

Significantly, the blue polarizer 48 is transparent to IR, and the IR polarizer 50 is transparent to blue. Thus, the XNOR and XOR functions are performed independently of one another, and the visible light elements (+1) and IR light elements (−1) can be written to the electron trapping layer 10 sequentially or simultaneously.

When the matrix elements +1 are written with blue light into the electron trapping layer, the number of trapped electrons at those locations are increased. Similarly, when the elements of −1 are written with IR light into the electron trapping layer, the number of trapped electrons at those locations are decreased A bias level is required to avoid the need for negative numbers of trapped electrons (a physical impossibility) in the electron trapping layer The bias level consists simply of an initial application of uniform blue light across the entire electron trapping screen, which evenly raises the number of trapped electrons at all pixel locations. Thereafter, the application of blue light at a particular location will increase the number of trapped electrons at that location, while the application of IR light will decrease the number of trapped electrons at that location.

The preferred electron trapping material has a dynamic range of $2^6$ and thus is capable of storing up to six matrices (consisting of +1, 0, −1) simultaneously. Thus, for example, if all six matrices stored have a +1 at a particular pixel location, that location would have the maximum level of trapped electrons, which could be detected with proper thresholding upon read out with IR light.

The capability of storing multiple matrices in the electron trapping layer allows the device to be used as an associative (content-addressable) memory. Thus, for example, if six vectors are stored in matrix form in the electron trapping layer and then an unknown vector is input into the electron trapping layer in the form of IR light, the vector-matrix multiplication output of visible light from the electron trapping layer will yield the vector that corresponds to the input vector stored in the electron trapping layer. If the input vector is close, but not identical to a stored vector, multiple iterations of vector-matrix multiplication will be necessary to retrieve the correct vector stored in the electron trapping layer. These iterations are performed by feeding back the output (after proper thresholding) as an input vector using the feedback lines 70 and feedback control 72 shown in FIG. 4. After about two or three iterations of vector-matrix multiplication, the stored vector closest to the original inputted vector will appear at the output of the system.

In lieu of using the polarizers/LCTV/analyzers setup shown in FIG. 4, the XOR and XNOR functions can be performed automatically by a computer with a video driver for displaying the appropriate mask pattern on the LCTV. Thus, the computer would, for example, determine the appropriate matrix representation for an input vector and, using graphics software, send the proper control signals to a video driver to display the appropriate mask pattern on LCTV 44 for writing the desired vector into the electron trapping layer.

In another embodiment of the invention, the LCTV is replaced by a laser diode array (coupled with a microlenslet array to obtain parallel light output). The laser diode array is controllable to emit infrared light at selected locations. To use this device in the present invention, the electron trapping material is initially flooded with blue light from the side so that all locations are fully charged The matrix or matrices to be stored in the electron trapping layer would then be written down with IR light using the laser diode array. Finally, the input vector would be applied with IR light from laser diode array to produce the desired vector-matrix multiplication.

The emission from the electron trapping layer 10 is detected by detector array 56 (whether a CCD, strip type silicon detector, or other type of detector). Then the electronic signal (which is in the matrix form) is integrated in the horizontal direction. Each element of the horizontally integrated vector is individually thresholded by thresholds 58. If the device is being used as an associative memory, the thresholded vector is checked to determine whether it has converged (i.e., checked to see if it is the same with the previous loop). If it has converged, it is the output; otherwise it is fed back to the input port. The whole operation requires a synchronization control 70.

Figure 8:
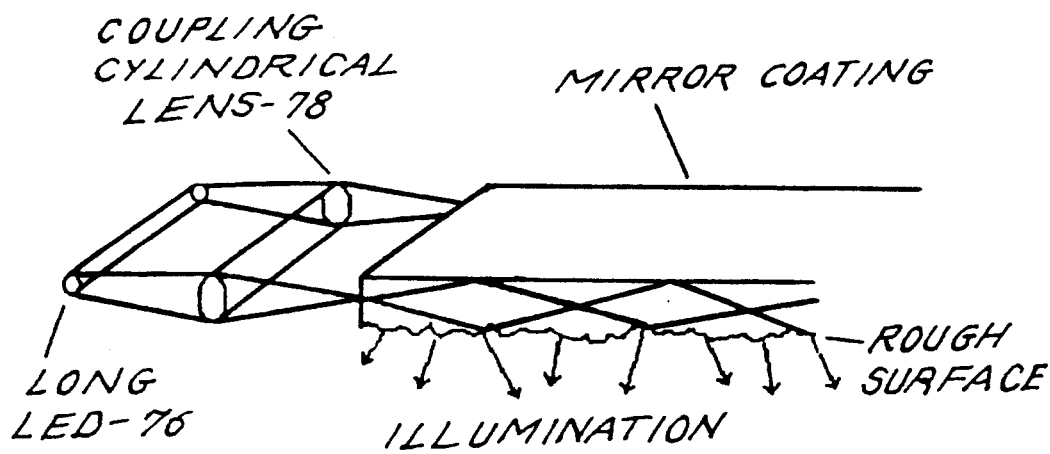
FIGS. 8 and 9 show the 2D flat illuminator used in the invention.
Figure 9:
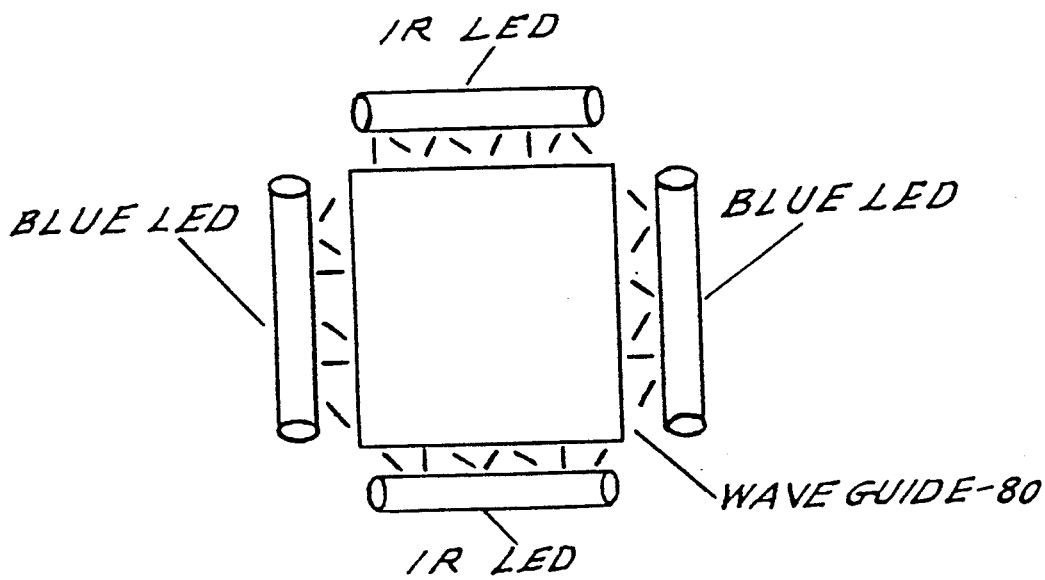

FIG. 8 shows the 2D flat illuminator 42 utilized in the system of the present invention To make a compact optoelectronic package, usual collimating optics cannot be applied. It is important to note that only incoherent light is required. The flat illuminator 42 is based on a waveguide. A linear LED 76 or a filtered light source emits IR or blue light. The emitted light is directed through a cylindrical lens 78 and into the slab waveguide 80 (e.g., sapphire or glass) The light will propagate in waveguide 80. However, one side of waveguide 80 is roughened such that the light can leave the waveguide. Light cannot leave waveguide 80 from the other side since it is polished and coated with a reflecting film. To produce a uniform illumination for both IR and blue, LEDs are arranged as shown in FIG. 9.

Figure 10:
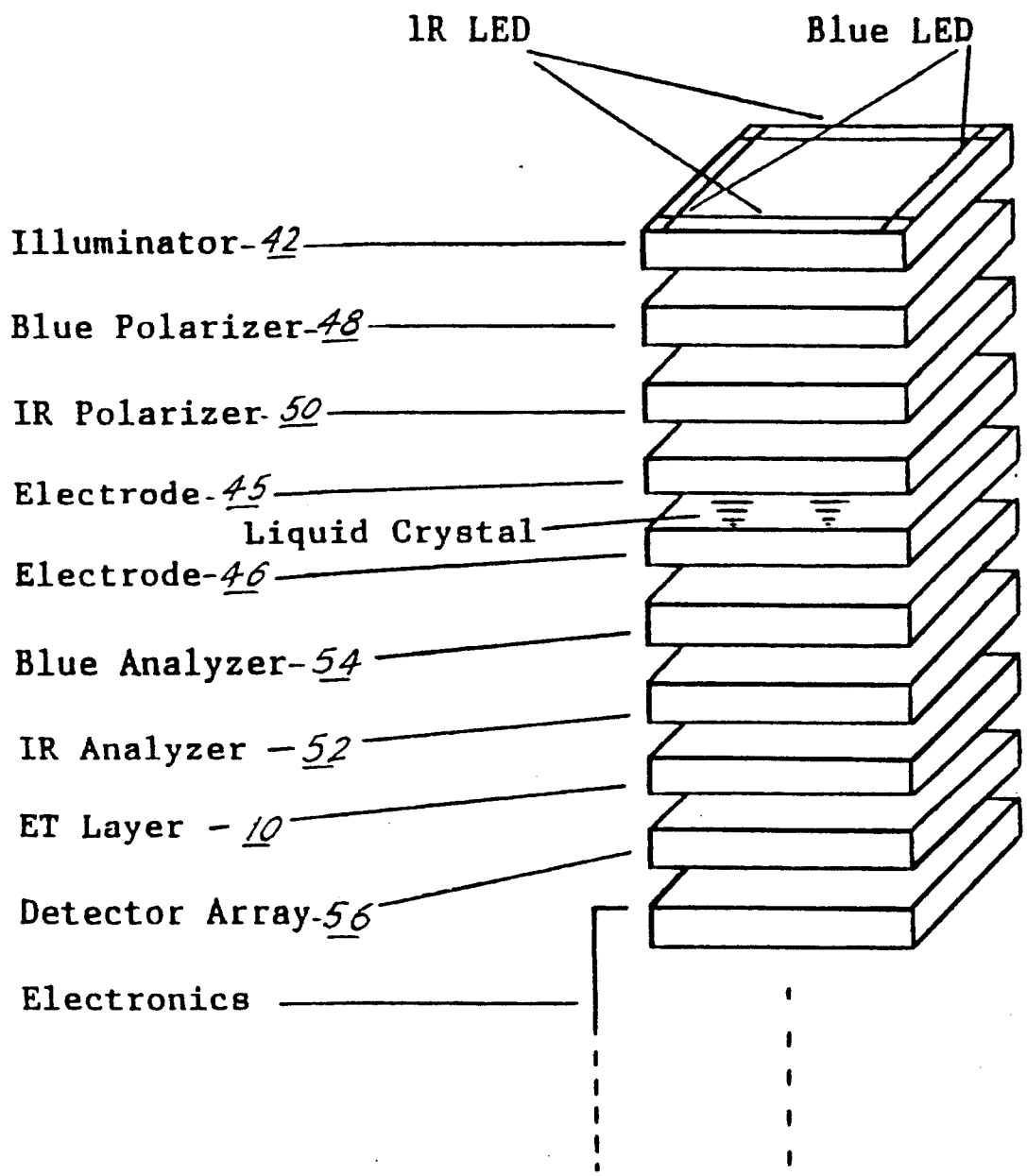
FIG. 10 shows the layering of the components of the invention to form a multilayer optoelectric chip.

The whole system can be packaged to be a multilayer optoelectronic chip as shown in FIG. 10. In the preferred embodiment, the entire system is preferably built as a macro-chip with approximate dimensions of $5 \times 5 \times 5$ cm$^3$.

Although the present invention has been described in connection with a preferred embodiment thereof, many other variations and modifications and other uses will now become apparent to those skilled in the art without departing from the scope of the invention. It is preferred, therefore, that the present invention not be limited by the specific disclosure herein, but only by the appended claims

What is claimed is:

1. An apparatus for conducting vector-matrix multiplication using an electron trapping material, comprising:
   a) a electron trapping material for storing images in the form of a pattern of electrons trapped at a higher energy level, said electrons being raised to said higher energy level at which they are trapped upon activation by exposure to visible light, said electrons being released from said higher energy level upon stimulation by exposure to infrared light, resulting in the emission of visible light from said material at locations at which electrons have been activated and stimulated; said electron trapping material comprising:
      (i) a base material selected from the group consisting of strontium sulfide, calcium sulfide, and a mixture of strontium sulfide and calcium sulfide;
      (ii) a first dopant of samarium; and
      (iii) a second dopant selected from the group consisting of a europium compound, a cerium compound, and a mixture of a europium compound and a cerium compound;
   b) illumination means for providing visible and infrared light for, respectively, activating and stimulating said electron trapping material;
   c) a liquid crystal device disposed between said illuminations means and said layer of electron trapping material for masking said visible light from said illumination means to form a pattern of visible light corresponding to a matrix to be stored in said electron trapping material, and for masking said infrared light from said illumination means to form a pattern of infrared light corresponding to a two-dimensional image of a vector to be optically multiplied with said matrix stored in said electron trapping material;
   d) control means for controlling said illumination means and said liquid crystal device so as to first expose said electron trapping material to a visible light image corresponding to the matrix to be stored, and then expose said electron trapping material to an infrared light image corresponding to the vector to be multiplied with said matrix; and
   e) detector means for converting the said optical signals outputted from said electron trapping material into an electrical output representing the product of said vector and said matrix.

2. An apparatus for conducting vector-matrix multiplication as recited in claim 1, further comprising means for feeding back said electrical output as an input vector, such that said apparatus functions as an associative memory.

3. An apparatus for conducting vector-matrix multiplication, comprising:

a) means for flooding an electron trapping material with visible light to uniformly charge said material by raising electrons in said material to a higher energy level, where they are trapped, said electron trapping material comprising:
   (i) a base material selected from the group consisting of strontium sulfide, calcium sulfide, and a mixture of strontium sulfide and calcium sulfide;
   (ii) a first dopant of samarium; and
   (iii) a second dopant selected from the group consisting of a europium compound, a cerium compound, and a mixture of a europium compound and a cerium compound;
b) an infrared diode array for:
   1) subjecting said electron trapping material to infrared light at selected locations such that electrons at the selected locations are released from their traps and fall back down to a lower energy level while the remaining locations of said material not exposed to said infrared light remain charged with trapped electrons in a pattern corresponding to a matrix to be stored; and
   2) subjecting said electron trapping material to a two-dimensional image of a vector in the form of infrared light, said infrared light releasing trapped electrons from said higher energy level, resulting in an emission of a pattern of visible light from said electron trapping material; and
c) means for detecting said emission of visible light from said electron trapping material to obtain an electrical output representing the product of said vector and said matrix.

* * * * *